United States Patent
He et al.

(10) Patent No.: US 12,368,415 B2
(45) Date of Patent: Jul. 22, 2025

(54) DUAL-BAND DIGITAL PRE-DISTORTION SYSTEM AND METHOD

(71) Applicant: Nokia Solutions and Networks Oy, Espoo (FI)

(72) Inventors: Tian He, Plano, TX (US); Chad Young, Carrollton, TX (US); Shavantha Kularatna, Flower Mound, TX (US); Peter Novak, Keller, TX (US); Jacob Edward Longwell, Northlake, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 906 days.

(21) Appl. No.: 17/455,278

(22) Filed: Nov. 17, 2021

(65) Prior Publication Data

US 2022/0173704 A1    Jun. 2, 2022

(30) Foreign Application Priority Data

Dec. 1, 2020  (FI) ..................... 20206233

(51) Int. Cl.
*H04L 25/49* (2006.01)
*H03F 1/32* (2006.01)
*H03F 3/21* (2006.01)

(52) U.S. Cl.
CPC ............ *H03F 1/3258* (2013.01); *H03F 3/21* (2013.01)

(58) Field of Classification Search
CPC .......... H03F 1/3247; H03F 2201/3233; H03F 2201/3224; H03F 1/3241;
(Continued)

(56) References Cited

U.S. PATENT DOCUMENTS

| | | |
|---|---|---|
| 8,619,906 B2 | 12/2013 | Bai |
| 2012/0200355 A1 | 8/2012 | Braithwaite |

(Continued)

FOREIGN PATENT DOCUMENTS

| | | |
|---|---|---|
| EP | 2824833 A1 | 1/2015 |
| WO | 2016/203294 A1 | 12/2016 |

OTHER PUBLICATIONS

Morgan et al., "A generalized memory polynomial model for digital predistortion of RF power amplifiers", IEEE Transactions on Signal Processing, vol. 54, No. 10, Oct. 2006, pp. 3852-3860.

(Continued)

*Primary Examiner* — Khai Tran
(74) *Attorney, Agent, or Firm* — Nokia Technologies Oy

(57) ABSTRACT

This specification relates to digital pre-distortion of signals before power amplification during the transmission of a signal. A method comprising: receiving an input signal $1^{st}$ and $2^{nd}$ subband signals associated with $1^{st}$ and $2^{nd}$ centre frequencies; applying a pre-distortion to the input signal to generate a pre-distorted signal, the pre-distortion applying an inverse to a power amplification model associated with a power amplifier; and outputting the pre-distorted signal for power amplification. The power amplification model or the inverse to the power amplification model comprises a first plurality of terms and a second plurality of terms. Each of the $1^{st}$ and $2^{nd}$ plurality of terms comprising a product of a complex coefficient, a power factor, and other factors depending on if it is $1^{st}$ or $2^{nd}$ plurality of terms.

14 Claims, 10 Drawing Sheets

(58) Field of Classification Search
CPC .......... H04B 2001/0425; H04L 27/367; H04L 27/368; H04L 27/366
USPC ........................................................ 375/296
See application file for complete search history.

(56) References Cited

U.S. PATENT DOCUMENTS

| | | | |
|---|---|---|---|
| 2015/0016567 A1* | 1/2015 | Chen | H03F 3/245 375/297 |
| 2015/0146822 A1 | 5/2015 | Copeland | |
| 2016/0119004 A1 | 4/2016 | Rollins | |
| 2016/0308577 A1 | 10/2016 | Molina et al. | |
| 2018/0175808 A1 | 6/2018 | Ota et al. | |
| 2019/0140605 A1* | 5/2019 | Hong | H03F 1/3247 |

OTHER PUBLICATIONS

Ding et al., "Concurrent dual-band digital predistortion", IEEE/MTT-S International Microwave Symposium Digest, Jun. 17-22, 2012, 3 pages.

Roblin et al., "Concurrent Linearization", IEEE Microwave Magazine, Nov./Dec. 2013, pp. 75-91.

Bassam et al., "Linearization of Concurrent Dual-Band Power Amplifier Based on 2D-DPD Technique", IEEE Microwave and Wireless Components Letters, vol. 21, No. 12, Dec. 2011, pp. 685-687.

Kelly et al., "Preparing Linearity and Efficiency for 5G: Digital Predistortion for Dual-Band Doherty Power Amplifiers with Mixed-Mode Carrier Aggregation", IEEE Microwave Magazine, vol. 18, No. 1, Jan.-Feb. 2017, pp. 76-84.

Wu et al., "Residual Neural Networks for Digital Predistortion", IEEE Global Communications Conference, Dec. 7-11, 2020, 6 pages.

Lu et al., "A Configurable Multi-Mode Digital Predistorter for Single-Band/Dual-Band RF Power Amplifiers With Economic Resource Consumption", International Conference on Microwave and Millimeter Wave Technology (ICMMT), May 7-11, 2018, 4 pages.

Wang et al., "A nonlinear filter-based model for concurrent dual-band power amplifiers", IEEE International Wireless Symposium, Mar. 30-Apr. 1, 2015, 4 pages.

Abdulkhaleq et al., "Design Techniques of Dual-Band Doherty Power Amplifiers for 5G Communications", Microwave/RF Components for 5G Front-End Systems, Nov. 2019, 41 pages.

Office action received for corresponding Finnish Patent Application No. 20206233, dated Apr. 27, 2021, 8 pages.

Office action received for corresponding Canadian Patent Application No. 3138900, dated Jan. 3, 2023, 4 pages.

* cited by examiner

| Order | $m$ | Complex factor (set $B$) | Power factor (both set $B$ and set $C$) | Complex factor (set $C$) |
|---|---|---|---|---|
| 1st | 0 | $x_1$ | 1 | $x_2$ |
| 3rd | 1 | $x_1^2 \overline{x_2}$, $x_1$ | 1, $|x_1|^2$, $|x_2|^2$ | $x_2^2 \overline{x_1}$, $x_2$ |
| 5th | 2 | $x_1^3 \overline{x_2}^2$, $x_1^2 \overline{x_2}$, $x_1$ | 1, $|x_1|^2$, $|x_2|^2$, $|x_1|^4$, $|x_1|^2|x_2|^2$, $|x_2|^4$ | $x_2^3 \overline{x_1}^2$, $x_2^2 \overline{x_1}$, $x_2$ |
| 7th | 3 | $x_1^4 \overline{x_2}^3$, $x_1^3 \overline{x_2}^2$, $x_1^2 \overline{x_2}$, $x_1$ | 1, $|x_1|^2$, $|x_2|^2$, $|x_1|^4$, $|x_1|^2|x_2|^2$, $|x_2|^4$, $|x_1|^6$, $|x_1|^6|x_2|^2$, $|x_1|^2|x_2|^4$, $|x_2|^6$ | $x_2^4 \overline{x_1}^3$, $x_2^3 \overline{x_1}^2$, $x_2^2 \overline{x_1}$, $x_2$ |
| 9th | 4 | $x_1^5 \overline{x_2}^4$, $x_1^4 \overline{x_2}^3$, $x_1^3 \overline{x_2}^2$, $x_1^2 \overline{x_2}$, $x_1$ | 1, $|x_1|^2$, $|x_2|^2$, $|x_1|^4$, $|x_1|^2|x_2|^2$, $|x_2|^4$, $|x_1|^6$, $|x_1|^6|x_2|^2$, $|x_1|^2|x_2|^4$, $|x_2|^6$, $|x_1|^8$, $|x_1|^6|x_2|^2$, $|x_1|^4|x_2|^4$, $|x_1|^2|x_2|^6$, $|x_2|^8$ | $x_2^5 \overline{x_1}^4$, $x_2^4 \overline{x_1}^3$, $x_2^3 \overline{x_1}^2$, $x_2^2 \overline{x_1}$, $x_2$ |

FIG. 2

| Frequency center | Complex factor | Power factor | Order | m |
|---|---|---|---|---|
| $\omega_1$ | $x_1$ | $1$<br>$\|x_1\|^2, \|x_2\|^2$<br>$\|x_1\|^4, \|x_1\|^2\|x_2\|^2, \|x_2\|^4$<br>$\|x_1\|^6, \|x_1\|^4\|x_2\|^2, \|x_1\|^2\|x_2\|^4, \|x_2\|^6$<br>$\|x_1\|^8, \|x_1\|^6\|x_2\|^2, \|x_1\|^4\|x_2\|^4, \|x_1\|^2\|x_2\|^6, \|x_2\|^8$ | 1<br>3<br>5<br>7<br>9 | 0<br>1<br>2<br>3<br>4 |
| $2\omega_1 - \omega_2$ | $x_1^2 \overline{x}_2$ | $1$<br>$\|x_1\|^2, \|x_2\|^2$<br>$\|x_1\|^4, \|x_1\|^2\|x_2\|^2, \|x_2\|^4$<br>$\|x_1\|^6, \|x_1\|^4\|x_2\|^2, \|x_1\|^2\|x_2\|^4, \|x_2\|^6$ | 3<br>5<br>7<br>9 | 1<br>2<br>3<br>4 |
| $3\omega_1 - 2\omega_2$ | $x_1^3 \overline{x}_2^2$ | $1$<br>$\|x_1\|^2, \|x_2\|^2$<br>$\|x_1\|^4, \|x_1\|^2\|x_2\|^2, \|x_2\|^4$ | 5<br>7<br>9 | 2<br>3<br>4 |
| $4\omega_1 - 3\omega_2$ | $x_1^4 \overline{x}_2^3$ | $1$<br>$\|x_1\|^2, \|x_2\|^2$ | 7<br>9 | 3<br>4 |
| $5\omega_1 - 4\omega_2$ | $x_1^5 \overline{x}_2^4$ | $1$ | 9 | 4 |

FIG. 3

DUAL-BAND DIGITAL PRE-DISTORTION SYSTEM AND METHOD

FIELD

This specification relates to digital pre-distortion of signals before power amplification during the transmission of a signal.

BACKGROUND

The last active stage of the transmit (TX) path in a macro-cell base station is the power amplifier (PA). It consumes the most power. To save power, the prevailing method is to drive the PA into compression to increase its efficiency. This introduces significant distortion to the transmitted signal. Digital pre-distortion (DPD) has been used widely to mitigate that. However, this task gets more and more difficult as the signal bandwidth (BW) grows wider and wider, as is the current trend of industry.

Multi-band DPD is one of the most effective solutions to this problem, with dual-band DPD being the most economical. However, conventional dual-band DPD requires: 1. A large ratio of sub-band frequency gap over sub-band BW; and 2. direct access to the sub-band signals uncontaminated by the other sub-band. In 5G applications, these constraints are not necessarily met, for example when the PA supports a contiguously wide BW. For example, the E-UTRA band N42 covers from 3400 MHz to 3600 MHz, spanning 200 MHz contiguously. Suppose two NR100 MHz signals are commissioned in band N42 side by side, there will then be virtually no separation between them, and access to the subbands cannot be obtained by filtering, as brick wall filters are not implementable.

SUMMARY

According to a first aspect of this specification, there is described a method comprising: receiving an input signal comprising a first subband signal associated with a first centre frequency, $\omega_1$, and a second subband signal associated with a second centre frequency, $\omega_2$; applying a pre-distortion to the input signal to generate a pre-distorted signal, the pre-distortion applying an inverse to a power amplification model associated with a power amplifier; and outputting the pre-distorted signal for power amplification. The power amplification model or the inverse to the power amplification model comprises a first plurality of terms and a second plurality of terms. Each of the first plurality of terms comprising a product of a complex coefficient, a power factor, and the first sub-band signal or the second subband signal, wherein each of the first plurality of terms is associated with a frequency centre of the first centre frequency or the second centre frequency. Each of the second plurality of terms comprising a product of a complex coefficient, a power factor and a complex factor comprising a product of the first subband signal raised to a first power and a conjugate of the second subband signal raised to second power or a product of the second subband signal raised to a first power and a conjugate of the first subband signal raised to second power, wherein each of the second plurality of terms is associated with a frequency centre of a difference between an integer multiple of the first centre frequency and an integer multiple of the second centre frequency.

The power factors may comprise a magnitude of the first subband signal, a magnitude of the second subband signal or a product of the magnitude of the first subband signal and the second subband signal.

Each of the integer multiples of the first frequency centre may differ from a corresponding integer multiply of the second frequency centre by one. The frequencies associated with the second plurality of terms may each be of the form $(\alpha-\beta)\omega_1-(\alpha-\beta-1)\omega_2$ or $(1+\beta-\alpha)\omega_2-(\beta-\alpha)\omega_1$, where $0 \leq \alpha \leq m+1$ and $0 \leq \beta \leq m$ and $2m+1$ is an order of the corresponding term.

The first power and second power may differ by one.

One or more of the complex factors in the second plurality of terms may comprise one or more delayed first subband signals and/or one or more a delayed second subband signals. One or more of the power factors may comprise a delayed first subband signal and/or a delayed second subband signal.

The first subband signal may comprise the input signal filtered by a first filter and the second subband signal may comprise the input signal filtered by a second filter. The second filter may be complementary to the first filter. The first filter and second filter may be complementary half-band filters.

Each of the plurality of second terms may comprise a part of the form:

$$x_1^{\alpha-\beta} \bar{x}_2^{\alpha-\beta-1} |x_1|^{2\beta} |x_2|^{2(m+1-\alpha)} \cdot e^{j((\alpha-\beta)\omega_1-(\alpha-\beta-1)\omega_2)nT}$$

when $\alpha > \beta$, and/or:

$$x_2^{1+\beta-\alpha} \bar{x}_1^{\beta-\alpha} |x_1|^{2\alpha} |x_2|^{2(m-\beta)} \cdot e^{j((1+\beta-\alpha)\omega_2-(\beta-\alpha)\omega_1)nT}$$

when $\alpha \leq \beta$, where $2m+1$ is the order of the term in the power amplification model.

The first input signal and/or second input signal may comprise a plurality of carriers.

The method may further comprise applying power amplification to the pre-distorted signal using a power amplifier.

According to a further aspect of this specification, there is described a base station comprising: a pre-distortion module configured to perform one or more of the methods disclosed herein; and a power amplifier configured to amplify the pre-distorted signal.

According to a further aspect of this specification, there is described a system comprising a pre-distortion module configured to perform any one or more of the methods disclosed herein.

According to a further aspect of this specification, there is described a computer program product comprising computer readable code that, when executed by a computing system, causes the system to perform any one or more of the methods disclosed herein.

BRIEF DESCRIPTION OF THE DRAWINGS

Embodiments will now be described by way of non-limiting examples with reference to the accompanying drawings, in which:

FIG. 2 shows an example of a table enumerating example complex factors and power factors for a PA model;

FIG. 3 shows a further example of a table 200 enumerating example complex factors and power factors for a PA model;

DETAILED DESCRIPTION

Figure 1:
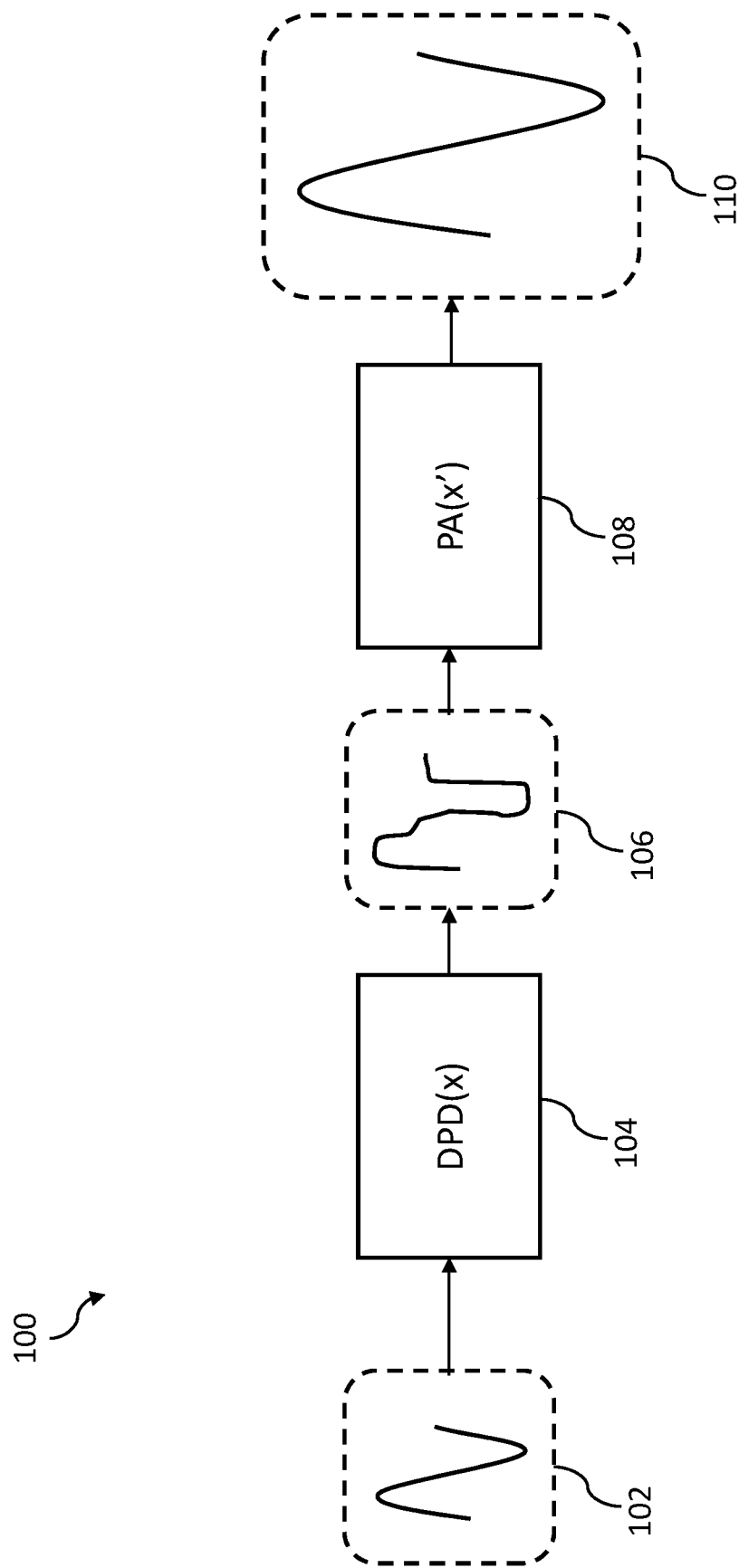
FIG. 1 shows a schematic overview of the operation of a system for amplifying an input signal.

FIG. 1 shows a schematic overview of the operation of a system 100 for amplifying an input signal 102. The system 100 may form part of a transmit path in a macro-cell base station. In general, the system 100 may be a sub-system of any system that includes power amplification of an input signal 102.

An input signal 102 (x), comprising at least two subband signals, is input into a pre-distortion module 104. The pre-distortion module 104 applies a pre-distortion (PD(x)) to the input signal 102 to generate a pre-distorted signal 106, x'. The pre-distortion is an inverse of a power amplification model associated with a power amplification module 108. The pre-distorted signal is input to the power amplification module 108, where it undergoes power amplification (PA (x')) to generate an amplified signal 110, y. The amplified signal can subsequently be transmitted.

The input signal 102 comprises a first subband signal, $X_1$, and a second subband signal, $X_2$, each of which may be associated with a centre frequency, $\omega_1$ for $X_1$ and $\omega_2$ for $X_2$. In general, each subband signal may comprise one broad carrier (e.g. NR-100 MHz) or a plurality of narrow carriers spread over a broad bandwidth (e.g. a bandwidth of 100 MHz). Examples of such narrow bands include LTE5, LTE10, NR20, NR40 and the like. The components input signal 102 may be written as:

$$x[n] = X_1[n] + X_2[n] = x_1[n]e^{j\omega_1 nT} + x_2[n]e^{j\omega_2 nT} \quad (1)$$

where $x_1$ and $x_2$ are the are baseband representations of the first and second subband signals respectively, and may in general be complex. For notational convenience, the explicitly dependency of the input signal 102 and the subband signals on n will often be omitted herein.

The input signal 102 may be a radiofrequency signal, such as a broadband radiofrequency signal. The input signal 102 my, for example, be a 4G or 5G radiofrequency signal, or the like.

The inverse to the power amplification model may be determined from knowledge of the PA model associated with the power amplifier. In other words, a PA model for a power amplifier is learned based on pairs of input and output signals to/from the power amplifier. This PA model is then inverted to determine the inverse to the power amplification model. Alternatively, the inverse to the PA model may be determined directly from knowledge of input and output pairs of the power amplifier. In the following description, the former case will be referred to, although it will be appreciated that the below can equally be applied to the latter case.

The PA model may be a multinomial expansion comprising a plurality of terms, each is term associated with a complex coefficient that may be learned based on pairs of input and output signals to/from the power amplifier. Each term in the multinomial expansion may additionally comprise a complex factor and a power factor. The power factor for a term is a real number corresponding to either unity or a product of the magnitudes of the first subband signal and/or second subband signal. Each term is further associated with a complex phase factor associated with a centre frequency of the term.

Such a PA model comprises a first plurality of terms, each of which comprises a product of a complex coefficient, a power factor, and either the first sub-band signal or the second subband signal. Each of the first plurality of terms is associated with a frequency centre of either of the first centre frequency, $\omega_1$, or the second centre frequency, $\omega_2$.

The PA model further comprises a second plurality of terms, each of which comprises a product of a complex coefficient, a power factor and a complex factor. The complex factor comprising a product of the first subband signal raised to a first power and a conjugate of the second subband signal raised to second power, or a product of the second subband signal raised to a first power and a conjugate of the first subband signal raised to second power. Each of the second plurality of terms is associated with a frequency centre offset from the first centre frequency, $\omega_1$, or the second centre frequency, $\omega_2$. The frequency centre may comprise a difference between an integer multiples of the first centre frequency and the second centre frequency, e.g. $p\omega_1 - q\omega_2$, where p and q are positive and/or negative integers.

The power factors of each term may comprise unity, a magnitude of the first subband signal raised to some power, a magnitude of the second subband signal raised to some power, or a product of the magnitude of the first subband signal and the magnitude of the second subband signal, each raised to some (in general different) power. The power may be an even power in each case.

Examples of such a PA model will now be derived.

A task of DPD is to identify a behavioural model of a PA accurately. A behavioural model is one that is built from the input, x, and output, y, signals of a PA. This problem comprises two dimensions, corresponding to the two characteristics of a PA: 1. Non-flat frequency response; and 2. Nonlinearity.

A linear system with a non-flat frequency response can be modelled by:

$$y = H(x) = \sum_{k=0}^{N} h_k x[n-k] \quad (2)$$

where H:E→E is a linear operator on E, a Banach space of bounded complex sequences, to which the input and output signals belong. This is known as the $l^\infty$ space, and more conditions can be added to make it square summable ($l^2$ space) or even absolutely summable ($l^1$ space). x is the input signal, x∈E. It is used herein interchangeably with the notation x[n]. y is the output signal, y∈E. It is used herein interchangeably with the notation y[n]. $\{h_k\}^N_{k=0}$ are filter coefficients of complex value, that may be learned.

A nonlinear system with a flat frequency response can be modelled by:

$$y = F(x) = \sum_{m=0}^{M} a_m x^{m+1} \bar{x}^m = \sum_{m=0}^{M} \alpha_m x|x|^{2m} \quad (3)$$

where $F:E \to E$ is a nonlinear operator on E whose operations may be pointwise. x is the input signal, $x \in E$, and $\bar{x}$ is the complex conjugate of x. y is the output signal, $y \in E$. $\{\alpha_m\}_{m=0}^{M}$ are filter coefficients of complex value, that may be learned. This model may be referred to herein as a memoryless PA model with polynomials. It may be considered frequency independent. The m-th term in the expansion has an order of 2m+1.

A PA as a nonlinear system with non-flat frequency response can be modelled using:

$$y = H_2 \circ F \circ H_1(x) \qquad (4)$$

where $H_1$ and $H_2$ are independent non-flat frequency responses, i.e. two (in general different) versions of equation 2.

Substituting equation (1) and (2) into (3), the number of terms grows tremendously. After singling out the most important terms, it becomes manageable—this is what one of the state-of-the-art modelling techniques called "Generalized Memory Polynomial (GMP) achieves. However, in order to improve accuracy while maintaining a low power consumption, new non-linear PA models are required.

In the following derivation, it will be assumed that the PA model is memoryless and that a clean separation of the signal x into $x_1$ and $x_2$ is readily available, while not imposing any requirement either on the frequency gap between $x_1$ and $x_2$, or the BW thereof. Subsequently, these assumptions will be relaxed: memory will be added to the model and the clean separation assumption will be dispensed with, showing a general DPD engine.

A memoryless PA model can be derived by substituting the representation of the input signal shown in equation 1 into the nonlinear PA model of equation (3). Each term (labelled by m) is given by:

$$x|x|^{2m} = (x_1 e^{j\omega_1 nT} + x_2 e^{j\omega_2 nT})^{m+1} (\bar{x}_1 e^{-j\omega_1 nT} + \bar{x}_2 e^{-j\omega_2 nT}). \qquad (5)$$

Expanding this out gives, for each m, a number of terms of the form:

$$x_1^{\alpha} \cdot x_2^{m+1-\alpha} \cdot \bar{x}_1^{\beta} \cdot \bar{x}_2^{m-\beta} \cdot e^{j(\alpha-\beta)\omega_1 nT} \cdot e^{-j\omega_2 nT} \qquad (6)$$

where $0 \leq \alpha \leq m+1$ and $0 \leq \beta \leq m$.

For example, choose $\alpha=1$ and $\beta=0$, then the summand would be $x_1 |x_2|^{2m} e^{j\omega_1 nT}$, which is centred at $\omega_1$ in frequency—this is because the factors that only contain $x_1$ or $x_2$ to a single power do not contribute to frequency shifts, only the factors including a complex exponential do.

In general, the frequency centre of the term in equation (6) is at a frequency of:

$$(\alpha-\beta)\omega_1 - (\alpha-\beta-1)\omega_2. \qquad (7)$$

Since $(\alpha-\beta)$ ranges from $-m$ to $m+1$, it then follows that that there are exactly $2m+2$ distinct frequency centres once equation (5) is fully expanded. In these embodiments, the pre-factors for $\omega_1$ and $\omega_2$ are integers, and differ from each other by one.

On the other hand, since distinct pairs of $(\alpha,\beta)$ correspond to distinct summands, it can be seen that there are $(m+2)(m+1)$ distinct summands in total. Put it formally, let:

$$A = \{(\alpha,\beta) | 0 \leq \alpha \leq m+1, 0 \leq \beta \leq m\} \qquad (8)$$

and denote $|A|$ as the cardinality of A, then:

$$|A| = (m+2)(m+1). \qquad (9)$$

There are several things to note about this:

(1) As $(m+2)(m+1) > 2m+2$ for all $m \geq 1$, some of the summands are bound to share is the same frequency centres;

(2) Set A can be partitioned equally to two disjoint subsets B and C, where:

$$B = \{(\alpha,\beta) \in A | \alpha > \beta\}$$

$$C = \{(\alpha,\beta) \in A | \alpha \leq \beta\}$$

$$|B| = |C| = (m+2)(m+1)/2$$

(3) The split of set A corresponds to the split of summands (terms) into two different types:

$$x_1^{\alpha-\beta} \bar{x}_2^{\alpha-\beta-1} |x_1|^{2\beta} |x_2|^{2(m+1-\alpha)} e^{j((\alpha-\beta)\omega_1 - (\alpha-\beta-1)\omega_2)nT}, (\alpha,\beta) \in B \qquad (10.1)$$

$$x_2^{1+\beta-\alpha} \bar{x}_1^{\beta-\alpha} |x_1|^{2\alpha} |x_2|^{2(m-\beta)} e^{j((1+\alpha-\beta)\omega_2 - (\beta-\alpha)\omega_1)nT}, (\alpha,\beta) \in C \qquad (10.2)$$

The products $x_1^{\alpha-\beta} \bar{x}_2^{\alpha-\beta-1}$ and $x_2^{1+\beta-\alpha} \bar{x}_1^{\beta-\alpha}$ in equations (10.1) and (10.2) form complex factors of the PA model. The products involving only the magnitudes of $x_1$ and $x_2$ (each raised to some positive, even power) in equations (10.1) and (10.2) form power factors of the PA model. Each summand is associated with a frequency given by the difference between an integer multiple of the first centre frequency and an integer multiple of the second centre frequency. This associated frequency is the frequency of a complex phase factor in the summand.

Each summand may be associated with a complex coefficient, $\sigma_{m\alpha\beta}$, that weights the summand (term) in the expansion. The complex coefficient may be determined using a learning/optimisation process based on input-output signal pairs of the power amplifier being modelled. In some embodiments, each summand may have its own learned complex coefficient.

FIG. 2 shows an example of a table 200 enumerating example complex factors and power factors for a PA model. The table 200 assumes that M=4 in equation (3), though it will be appreciated that any integer value of M>1 may alternatively be used.

The first column 202 of the table 200 shows the order of the term, i.e. the sum of the exponents in the complex factor and the power factor. The second column 204 shows the value of m in equation (3) that the term corresponds to. Note that the order is 2m+1. The third column 206 shows the complex factors for the terms in set B. The fourth column 208 shows all the power factors that may be associated with the complex factors in their row in the third column 206 and fifth column 210. The fifth column 210 shows the complex factors for the terms in set C.

Note that frequency information is not displayed in FIG. 1; it is determined from the exponents of the complex factors. For a complex factor of the form $x_i^p \bar{x}_n^q$, the associated frequency is $(p\omega_i - q\omega_j)$. As an illustrative example, the term $x_1^3 \bar{x}_2^2 |x_1|^2$ is located at $(3\omega_1 - 2\omega_2)$, and the term $x_2^4 \bar{x}_1^3 |x_1|^2$ is located at a frequency of $(4\omega_2 - 3\omega_1)$.

To generate a term in the PA model from the table, one element from one of the two complex factor columns is chosen, and another term from the power factor of the same row is chosen. These are multiplied, and the associated complex phase included based on the frequency associated with the complex factor. The term is also multiplied by the associated complex coefficient that weights the term.

The terms in FIG. 2 can be reorganised according to their frequency centres. This is shown in the table 300 in FIG. 3. Once again, the table 300 assumes that M=4 in equation (3), though it will be appreciated that any integer value of M>1 may alternatively be used. Furthermore, only half of the terms are shown in FIG. 3; the other half of the terms can be generated by swapping $x_1$ and $x_2$ in the complex factor, and swapping $\omega_1$ and $\omega_2$ in the frequency centre.

The first column 302 of the table 300 shows the frequency associated with the term, corresponding to the frequency of a complex phase factor associated with the term, as shown in equations (10.1) and (10.2). The second column 304 shows the complex factors for the terms in set B. The third column 306 shows all the power factors that may be associated with the complex factors in their row in the second column 304. The fourth column 308 shows order of the term, i.e. the sum of the exponents in the complex factor and the power factor. The fifth column 310 shows the value of m in equation (3) that the term corresponds to. Note that the order is 2m+1.

To generate a term of the PA model from the table, a complex factor from the second column 304 is selected and multiplied with an associated power factor from the third column 306. This product is multiplied by a phase factor comprising a complex exponential at a frequency of the frequency centre associated with the selected complex factor (i.e. the associated centre frequency in the first column 302). The term is completed by including a complex coefficient that weights the term in the PA model. The value of this coefficient may be learned from input-output signal pairs of the power amplifier being modelled.

A first plurality of terms of the PA model (or its inverse) are formed from elements of the set of terms in the table associated with a frequency centre of $\omega_1$, and the corresponding "swapped" terms associated with a frequency centre of $\omega_2$ (i.e. the first column 302 of the table 300). Terms in the first plurality of terms have a complex factor of either $x_1$ or $x_2$ (i.e. the first or second subband signals). The first plurality of terms is sufficient to model a PA accurately under the assumption that the rest of the groups do not encroach upon them in frequency, which may be guaranteed by a large ratio of sub-band separation over sub-band BW.

However, when this assumption does not hold additional terms from other frequency centres may be included to produce an accurate PA model. A second plurality of terms may be formed from the terms associated with the frequencies offset from the first and second frequency centre (i.e. columns 304, 306, 308 and 310 of table 300). Each of such terms in the second plurality of terms has a complex factor of the form $x_i^p \bar{x}_j^q$, where $i \neq j$. The exponents, p and q, may differ by one, e.g. q may be one less than p.

The inclusion of this second plurality of terms allows a working dual-band engine to be produced that is effective regardless of whether the assumption of a large ratio of subband separation over subband BW holds or not.

Figure 4:
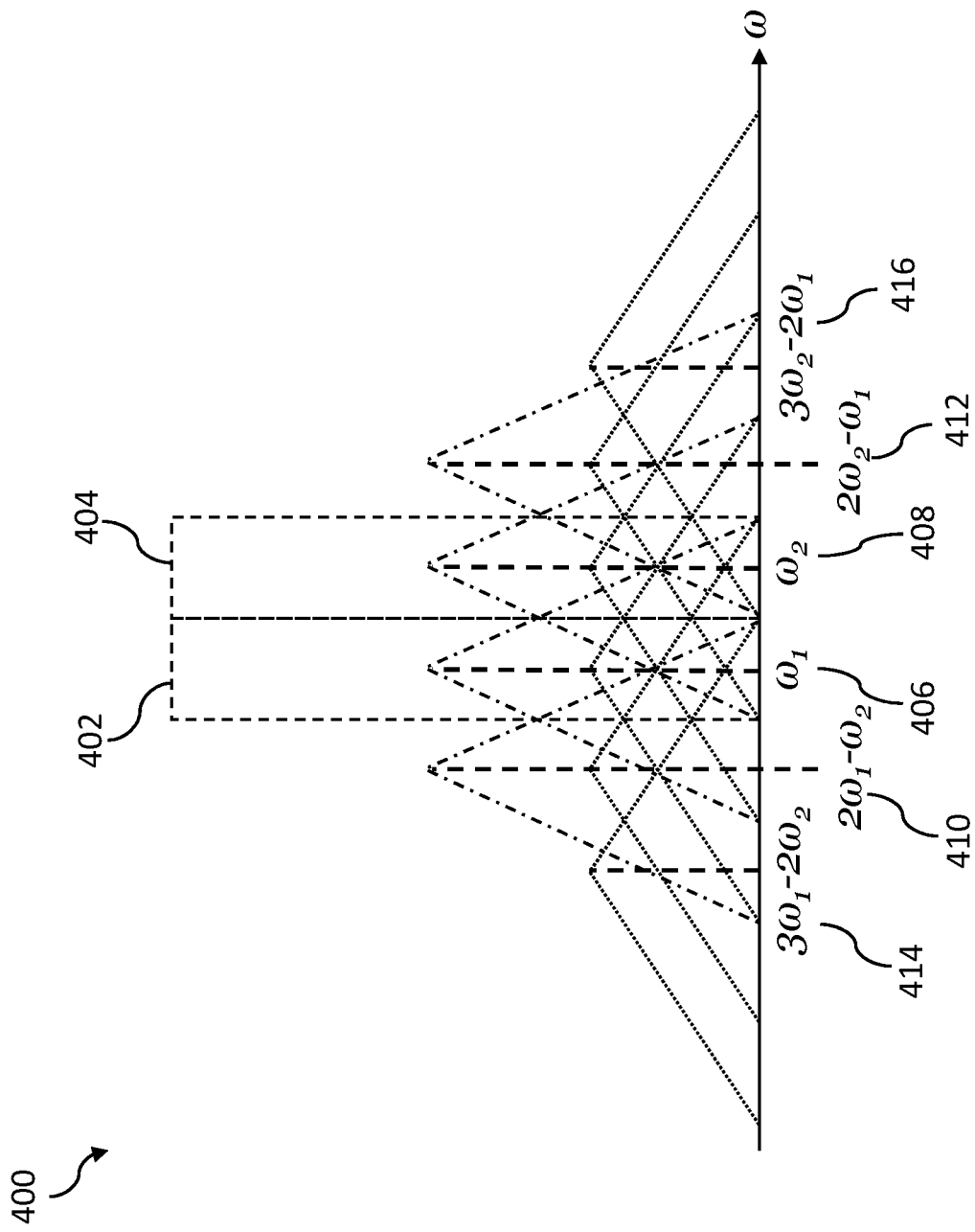
FIG. 4 shows an example of a frequency spectrum of terms used in a PA model.

FIG. 4 shows an example of a frequency spectrum 400 of terms used in a PA model. In this example, there is no gap between the first subband signal 402, $x_1 e^{j\omega_1 nT}$, and the second subband signal 404, $x_2 e^{j\omega_2 nT}$, making the ratio of gap over BW zero. In this is example, it is assumed that the BW of the first 402 and second 404 subband signals is identical, though in general this need not be the case.

The frequency spectrum of the groups of terms 406, 408 in the PA model centred at $\omega_1$ and $\omega_2$ are shown (i.e. those that correspond to the first plurality of terms), as well as the groups of terms 408, 410, 412, 416 centred at four other centre frequencies of the PA model (which correspond to the second plurality of terms). It can be seen that the groups of terms 408, 410, 412, 416 at the other frequencies centres encroach on the groups centred at $\omega_1$ and $\omega_2$ 404, 406, and thus should be included in the PA model. Note that greater or fewer additional terms may be included in the PA model. The number of terms included may depend on the subband BWs and subband separation of the first and second subbands.

Figure 5:
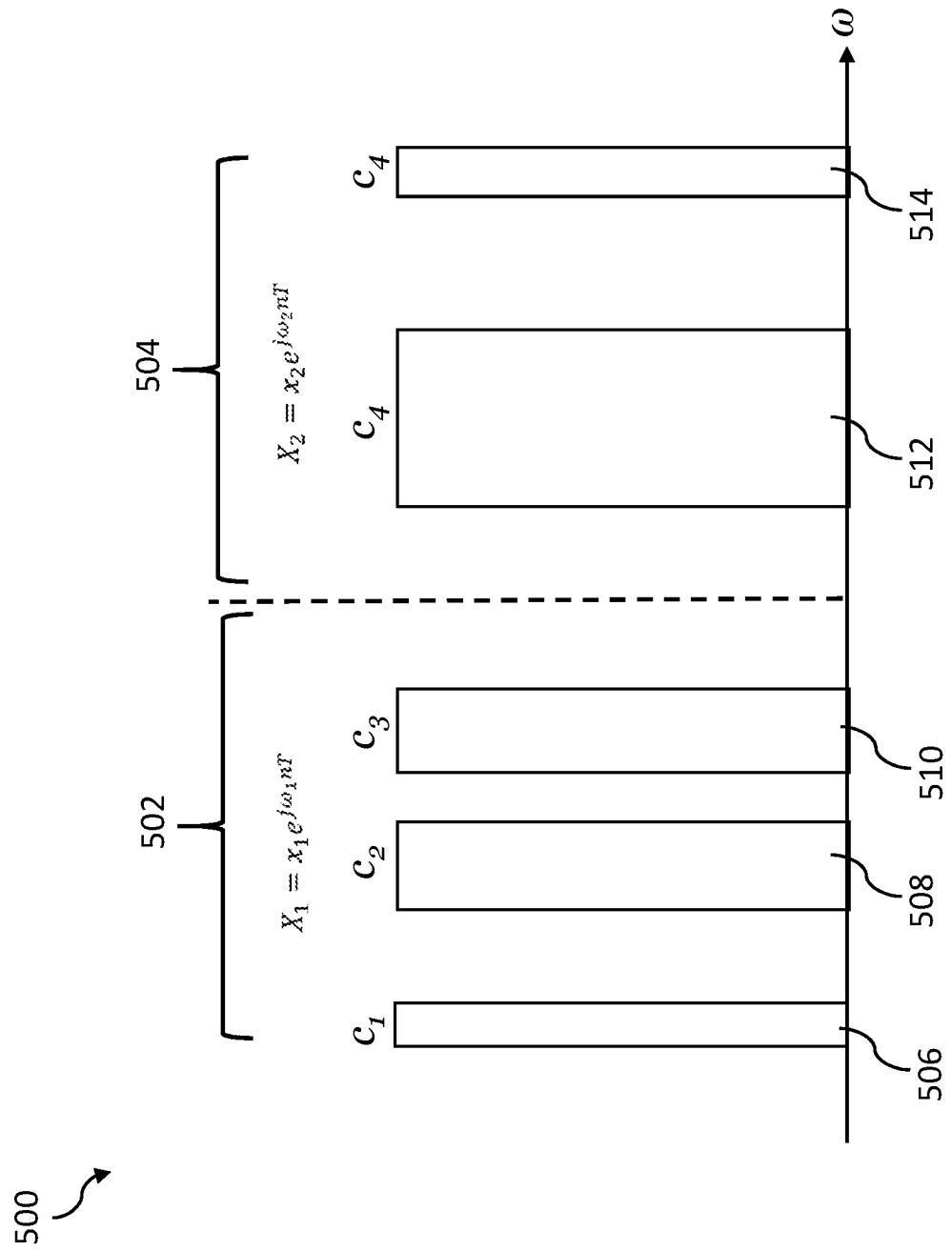
FIG. 5 shows an example carrier configuration in which a multiple-carrier signal is grouped into two subband signals.

In general, each of the first and second subband do not need to be contiguous. FIG. 5 shows an example carrier configuration 500 in which a multiple-carrier signal is grouped into two subbands 502, 504, each of which contains one or more carriers. In this example, the first subband 502, $X_1$, comprises plurality of carriers (in this case three carrier signals, c1 506, c2 508, and c3 510). The second subband signal 504, X2, comprises a plurality of carriers (in this case two carrier signals, c4 512 and c5 514). It will be appreciated that other configurations are possible, e.g. the first subband 502 may have a plurality of carrier signals and the second subband 504 may have a single carrier signal, or vice versa.

In general, depending on the frequency gap between the sub-bands, some of the terms in an expansion of the PA model are not used for a given carrier configuration. This however is not a problem for the following reasons: (1) It is not difficult to automatically determine what terms are relevant given a specific carrier configuration; and (2) Even if some irrelevant terms are included for a specific carrier configuration, model identification can be configured to return trivial coefficients for those terms, consequently nulling their impact on the PA model. In this sense, this engine is agnostic of the carrier configurations of x, assuming the carriers can be grouped to two subbands that are readily accessible to the system.

In some embodiments, memory can be introduced to the model to allow for a non-flat frequency response. Delays may be introduced to one or more of the complex factors in the first and/or second plurality of terms. Alternatively or additionally, delays may be introduced to one or more of the power factors in the first and/or second plurality of terms.

To declutter notation, the following notation for the first subband signal, $X_1$, and the second subband signal, $X_2$, will be used in the discussion of the memory model:

$$X_i[n] = x_i[n] e^{j\omega_i nT}$$

where $X_i \in E$, and $i \in \{1,2\}$ and $x_i$ is a baseband representation of subband signal i. In this notation, the terms in equation (3) can be written in a memoryless form as:

$$(X_1[n]+X_2[n])^{m+1}(\bar{X}_1[n]+\bar{X}_2[n])^m \quad (11)$$

To introduce memory, each factor in equation (11) can be expanded and (in general unique) delays for each factor can be introduced. The equation (11) can then be written in the general form:

$$\prod_{k=1}^{m+1}(X_1[n-d_{1,k}]+X_2[n-d_{2,k}])\prod_{l=1}^{m}(X_1[n-d_{3,k}]+X_2[n-d_{4,k}]) \quad (12)$$

which reduces to equation (11) when all the delays are set to zero. In practice, not all delay combinations in equation (12) are equally as important, and limited computational/hardware resources make it undesirable to include all delay combinations. Therefore, in some embodiments a subset of delays may be used.

In some embodiments, a delay may be introduced to the complex factor of a term as a whole. Alternatively or additionally, a delay may be introduced to the power factor of a term as a whole. Each term in such a PA model may written in the form:

$$X_i^{p+1}\bar{X}_j^p[n-d_1] \cdot |X_i|^{2\alpha}|X_j|^{2\beta}[n-d_2]$$

where the values of i, j, p, α and β are chosen from the table in FIG. 2 or FIG. 3. $d_1$ is the delay of the complex factor and $d_2$ is the delay of the power factor. The values of these delays may be determined using an optimisation procedure. At least some of the delays may be zero, so that at most each term has two delay values.

In some embodiments, four delays are introduced: three in the complex factor and one in the power factor. Each term in such a PA model may be written in the form:

$$\frac{X_1[n-d_1](X_1[n-d_2]}{\overline{X_2[n-d_3]})^m |X_1[n-d_4]|^{2\alpha}|X_2[n-d_4]|^{2\beta}}$$

where the values of i, j, m, α and β are chosen from the table in FIG. 2 or FIG. 3. $d_1$, $d_2$ and $d_3$ are the delays of the complex factor and $d_4$ is the delay of the power factor. The values of these delays may be determined using an optimisation procedure. At least some of the delays may be zero, so that at most each term has four delay values.

In the preceding description, it has been assumed that the dual-band pails $X_1$ and $X_2$ of the composite input signal x are readily available, for example as illustrated in FIG. 5. In some situations, this assumption may not hold, as it may be that the signal going into DPD is only accessible in its entirety. In these situations, access to the subbands may be gained via filtering. However, filters cannot achieve brickwall response, so for cases where the gap between subbands is small (or even zero), it may not be possible to separate them cleanly. A similar situation occurs when the signal is a single carrier wideband signal. For example, a single carrier 5G NR100 itself is 100 MHz wide, and it may not be possible to get a clean copy of the lower 50 MHz and the upper 50 MHz via filtering.

Figure 6:
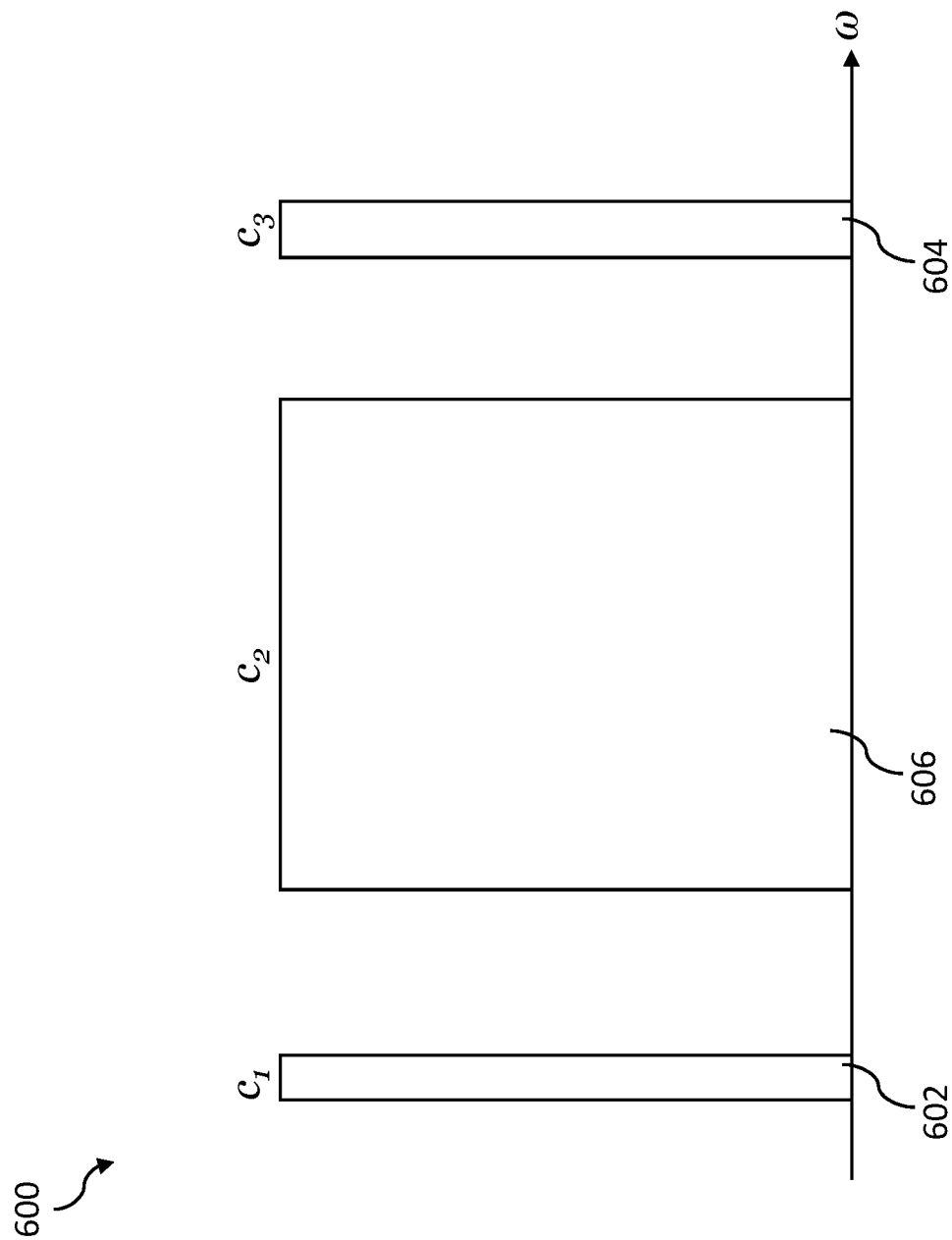
FIG. 6 shows an example carrier configuration.

Even if it is possible to access the sub-bands cleanly, it may not be desired. FIG. 6 illustrates such an example. Suppose the input signal x consists of two LTE5 carriers 602, 604 and an NR50 carrier 606, spanning a total BW of 100 MHz. A clean split would entail either carrier #1 602 and #2 606 are grouped to a sub-band, or carriers #2 606 and #3 604 are grouped. Neither is a desirable split, as each would contain a sub-band that is wide, diminishing the benefit of a dual-band engine.

The methods described herein can additionally be used in these situations. The derivations of the PA model outlined above do not rely on the assumption that $X_1$ and $X_2$ are not overlapping, so can be applied to any composite signal. In general, the methods described herein take a composite signal x, partition it into two parts, $X_1$ and $X_2$, perform a multinomial expansion to generate all the potential terms of PA model algebraically, and builds a PA model using all or part of these terms. This is true regardless of how the partitioning is done. That means, $X_1$ and $X_2$ can deviate significantly from the original assumption, and the terms proposed would still form a valid DPD engine, although it may not be a dual-band engine anymore. As an extreme example, suppose $X_1=X_2=0.5x$, then the proposed engine would fall back to a single band DPD engine.

Figure 7:
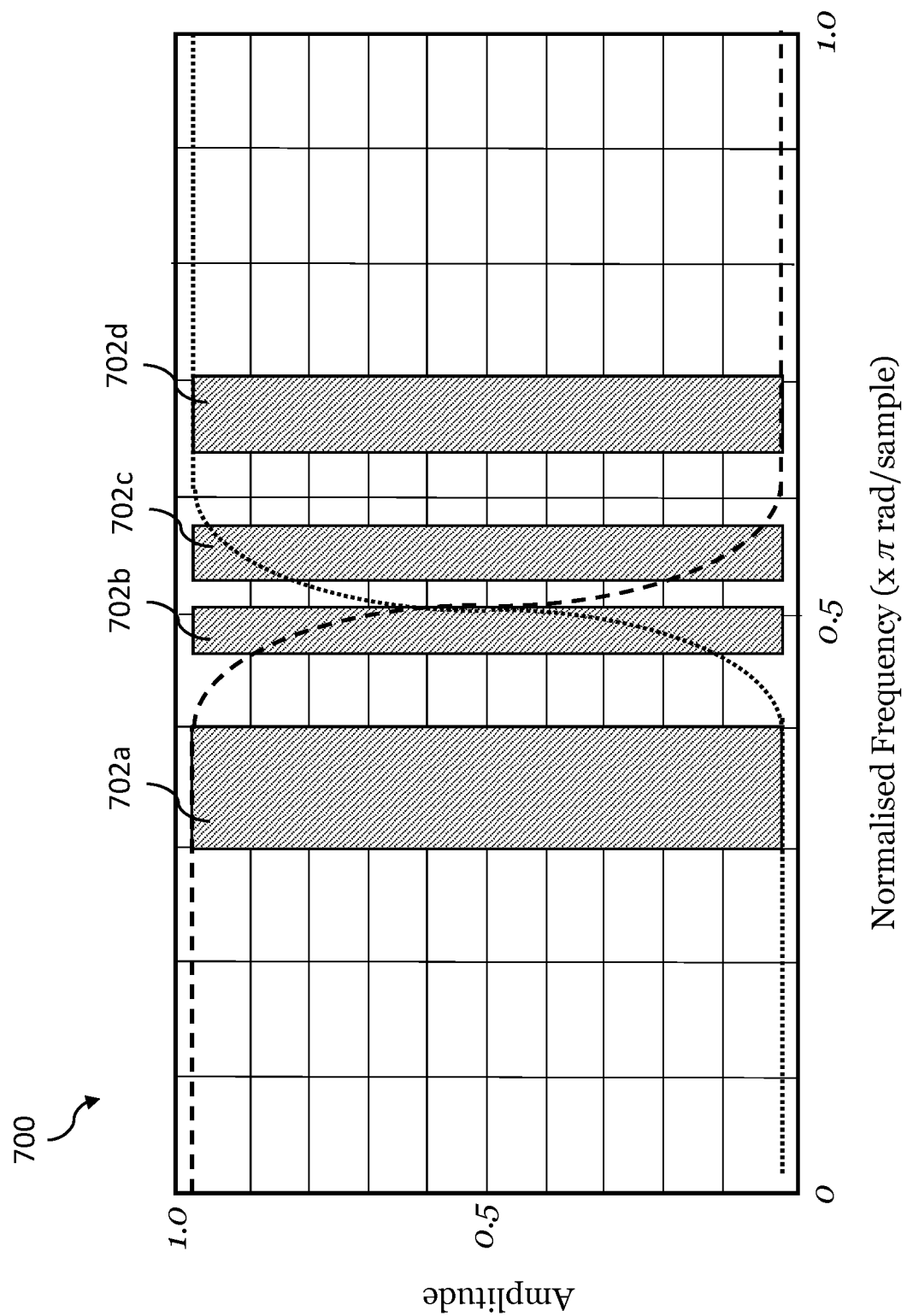
FIG. 7 shows an example of generating two subband signals from an input signal using complementary filters.

Thus, some overlap of the first subband signal, $X_1$, and the second subband signal, $X_2$, is allowed, as long as they sum to the input signal, x. A complementary filter can therefore be used to split the input signal, x, into the first and second subband signal. An example of such a filter 700 is shown in FIG. 7. In this example, the input signal comprises four carriers 702a-d. A first frequency-dependent filter 704 (indicated by the dashed line) is applied to the input signal 702 to generate a first subband signal. The first filter 704 takes values (amplitudes) between zero and one. A second frequency-dependent filter 706 (indicated by the dotted line) is applied to the input signal 702 to generate a second subband signal. The second filter 704 takes values (amplitudes) between zero and one, and is complementary to the first (i.e. their amplitudes sum to one). FIG. 7 shows a half band filter, though other types of filter may alternatively be used.

Formally, let $M_1: E \rightarrow E$ be any linear filter that rejects part of x, $I: E \rightarrow E$ be the identity operator on E and define $M_2: E \rightarrow E$ as $M_2 = I - M_1$. Then:

$X_1 = M_1 x$ $X_2 = M_2 x$ $X = X_1 + X_2$

Notice that $M_1$ and $M_2$ are by definition complementary filters, regardless of the specific filter response of $M_1$. The filter may be chosen based on the specific power amplifier being used. Alternatively, a generic filter may be used. An example of such a generic filter is a half-band filter, such as the filter shown in FIG. 7. In this example, the centre frequency of x is aligned with 0.5π rad/sample of the filter.

Note that throughout the preceding description, a form of direct learning algorithm (DLA) is assumed to have been used to determine the complex coefficients, where the model is built with the undistorted TX signal x, and identified against the FB signal y. This is only for the conciseness of presentation. The same principle works with other forms (DLA) also, and indirect learning algorithm as well, where an inverse model is built with y, and identified against x.

Figure 8:
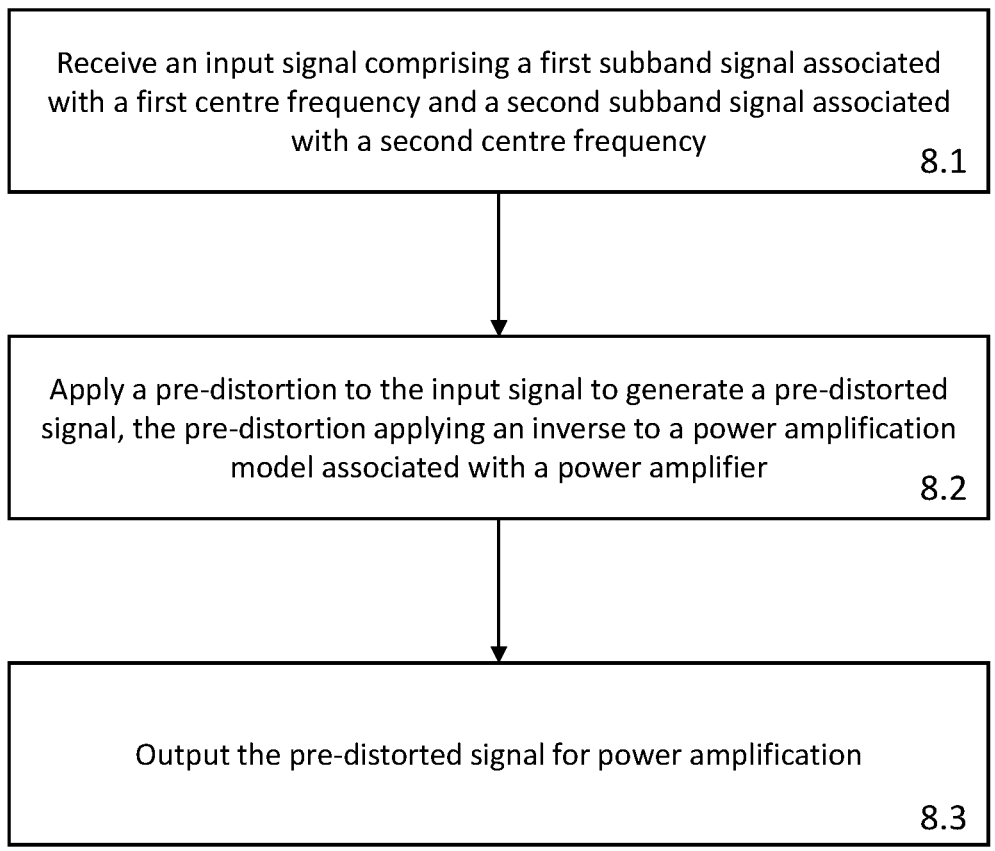
FIG. 8 shows a flow diagram of an example method for of applying digital pre-distortion.

FIG. 8 shows flow diagram of an example method of applying digital pre-distortion. The method may be performed by a base station, for example in a pre-distortion module of the base station. A pre-distortion module may be integrated with a power amplifier in the base station. Alternatively, it may be a separate module.

At operation 8.1, an input signal, x, comprising a first subband signal, $X_1$, associated with a first centre frequency, $\omega_1$, and a second subband signal, $X_2$, associated with a second centre frequency, $\omega_2$, is received. The input signal may be received at a pre-distortion module.

The first and second subband signals signal may be directly available from the input signal, or otherwise. For example, there may be no overlap between the first and second subband signals, or there may be a gap between them. Each of the first and second subband signals may comprise one or more carriers, i.e. each may comprise grouped multi-carrier signals, as shown in FIG. 5.

In some embodiments, only the full input signal, x, may be available, and the first and second subband signals are derived from it. The first subband signal may be derived from the input signal using a first filter and the second subband signal may be derived from the input signal using a second filter. The second filter is complementary to the first filter. The first filter and the second filter are complementary half-band filters, which may be centred on the centre frequency of the input signal, x.

At operation 8.2, a pre-distortion is applied to the input signal to generate a pre-distorted signal. The pre-distortion applies an inverse to a power amplification (PA) model associated with a power amplifier.

The PA model (or the inverse to the power amplification model) may comprise a multinomial expansion comprising a plurality of terms. The plurality of terms comprises a first plurality of terms and a second plurality of terms.

Each of the first plurality of terms comprises a product of a complex coefficient, a power factor, and the first sub-band signal or the second subband signal. Each of the first plurality of terms is associated with a frequency centre of the first centre frequency, $\omega_1$, or the second centre frequency, $\omega_2$. The first plurality of terms may, for example, comprise a plurality of terms from the first row of the table in FIG. 3, and/or their 1↔2 equivalents.

Each of the second plurality of terms comprises a product of a complex coefficient, a power factor and a complex factor.

Each of the second plurality of terms is associated with a frequency centre of a difference between an integer multiple of the first centre frequency, $\omega_1$, and an integer multiple of the second centre frequency, $\omega_2$, i.e. $p\omega_1 - q\omega_2$ where p and q are positive and/or negative integers. The integer multiples of the first frequency centre, p, may differ from the corresponding integer multiple of the second frequency centre, q, by one, i.e. $p = q \pm 1$. In some embodiments, the frequencies associated with the second plurality of terms are each of the form $(\alpha - \beta)\omega_1 - (\alpha - \beta - 1)\omega_2$, where $0 \leq \alpha \leq m+1$ and $0 \leq \beta \leq m$ and $2m+1$ is an order of the corresponding term (i.e. the sum of all the exponents is of subband signals in the term).

The complex coefficients of the terms may have been learned/fitted using known input-output signal pairs from the associated power amplifier.

The complex factors of the second plurality of terms may comprise a product of the first subband signal raised to a first power and a conjugate of the second subband signal raised to second power, i.e. $X_1^n \overline{X}_2^m$, where m and n are integers. The complex factors of the second plurality of terms may further comprise a product of the second subband signal raised to a first power and a conjugate of the first subband signal raised to second power, i.e. $X_2^n \overline{X}_1^m$, where m and n are integers. The first and second power may differ by one, e.g. $n = m+1$.

One or more of the complex factors in the second plurality of terms may comprise one or more delayed first subband signals and/or one or more a delayed second subband signals.

The power factors of the first and second plurality of terms are real numbers and may comprise unity, a magnitude of the first subband signal (in general raised to some even power, $|X_1|^{2\alpha}$), a magnitude of the second subband signal (in general raised to some even power, $|X_2|^{2\beta}$) or a product of the magnitude of the first subband signal and the second subband signal (each in general raised to some even power, e.g. $|X_1|^{2\alpha}|X_2|^{2\beta}$).

One or more of the power factors may comprise a delayed first subband signal and/or a delayed second subband signal, e.g. $|X_1[n-d_3]|^{2\alpha}|X_2[n-d_4]|^{2\beta}$ where $d_3$ and $d_4$ are delays. In some embodiments, $d_3$ is equal to $d_4$.

In some embodiments, the plurality of second terms comprises one or more terms of the form:

$$\sigma_{m,\alpha,\beta} X_1^{\alpha-\beta} \cdot \overline{X}_2^{\alpha-\beta-1} \cdot |X_1|^{2\beta} \cdot |X_2|^{2(m+1-\alpha)}$$

when $\alpha > \beta$, and/or:

$$\sigma_{m,\alpha,\beta} X_2^{1+\beta-\alpha} \cdot \overline{X}_1^{\beta-\alpha} \cdot |X_1|^{2\beta} \cdot |X_2|^{2(m-\beta)}$$

when $\alpha \leq \beta$, where $2m+1$ is the order of the term in the power amplification model and $\sigma^{B/C}_{m\alpha\beta}$ is the complex coefficient of the term.

At operation 8.3, the pre-distorted signal is output for power amplification. The pre-distorted signal may be input into a power amplifier, where it undergoes power amplification to generate an amplified signal. The amplified signal may be transmitted.

Throughout this specification, example embodiments have been described that utilise memory polynomials as a reference to discuss the characteristics of the invention. The use of memory polynomials lends itself to an ease of Mathematical operation.

However, the examples and embodiments described herein can alternatively utilize Spline methods to substitute all the non-linear orders (e.g. M=4, order=9) used in the description. There the user may pursue splines to represent sub-band signals $x_1$ and $x_2$. This keeps the frequency centres described in Table 300 intact. Additionally, the user may add splines using the full composite for pre-distortion in both sub-bands. Full composite is the aggregate of $x_1$ and $x_2$ (i.e. $x = x_1 + x_2$). In general, the PA model may consist of splines generated with $x_1$, $x_2$, and x while keeping the rest of the details of the disclosure intact.

Figure 9:
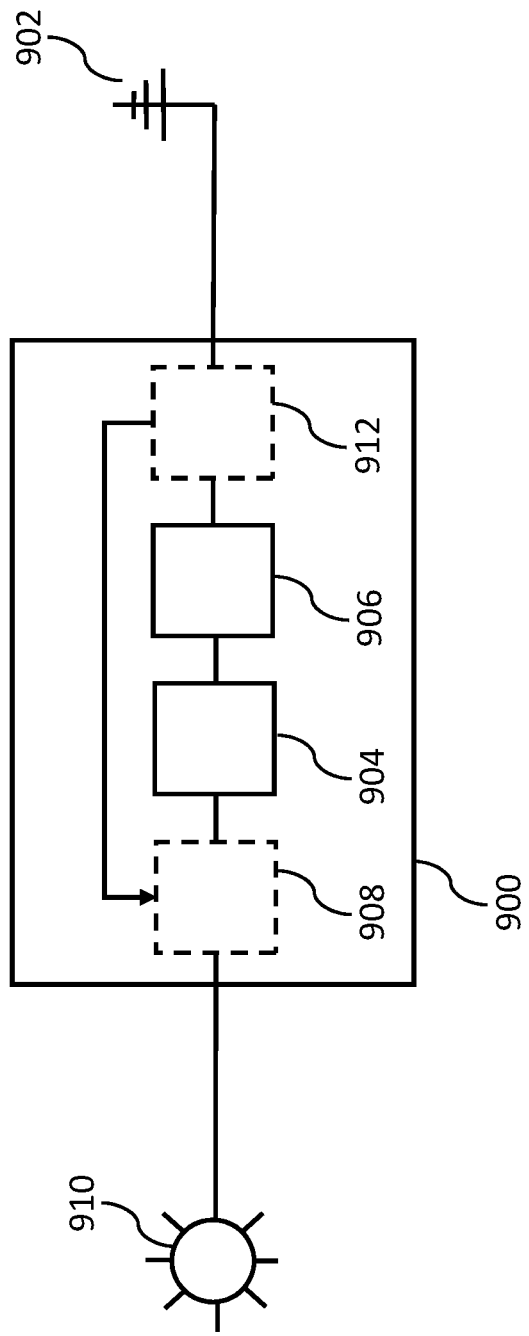
FIG. 9 shows a schematic overview of a base station connected to an antenna.

FIG. 9 shows a schematic example of a base station 900 connected to an antenna 902. A base station 900 is a network element providing an air interface between the radio units of mobile subscribers and the networks infrastructure (sometimes referred to as Switching and Management Infrastructure, SwMI). The base station is responsible for radio transmission and reception to and from wireless subscriber stations over the air interface. A base station may alternatively be known as a nodeB, eNodeB, gNodeB or simply transmission point (TP). Many examples of base station structures will be familiar to the skilled person.

In the example shown, the base station comprises a pre-distortion module 904 and a power amplification module 906 (also referred to as a power amplifier). The pre-distortion module 904 is configured to apply a pre-distortion to an input signal, for example using any of the methods disclosed herein, and output the pre-distorted signal to the power amplifier 906. The power amplifier 906 amplifies the pre-distorted signal to generate an amplified signal, and outputs the amplified signal for transmission via the antenna 902.

The base station 900 may further comprise a front-end module 908 connected to a network 910. The front-end module 908 can send and/or receive signals to/from the network 910. The front-end module 908 may perform modulation and/or filtering on received signals received from the network 910 and/or the antenna 902.

The base station 900 may further comprise a duplexer module 912 (also referred to as a duplexer). The duplexer 912 routes signals received from the power amplifier 906 to the antenna 902 and routes signals received from the antenna 902 to the front-end module 908, bypassing the power amplifier 906 and pre-distortion module 904.

Figure 10:
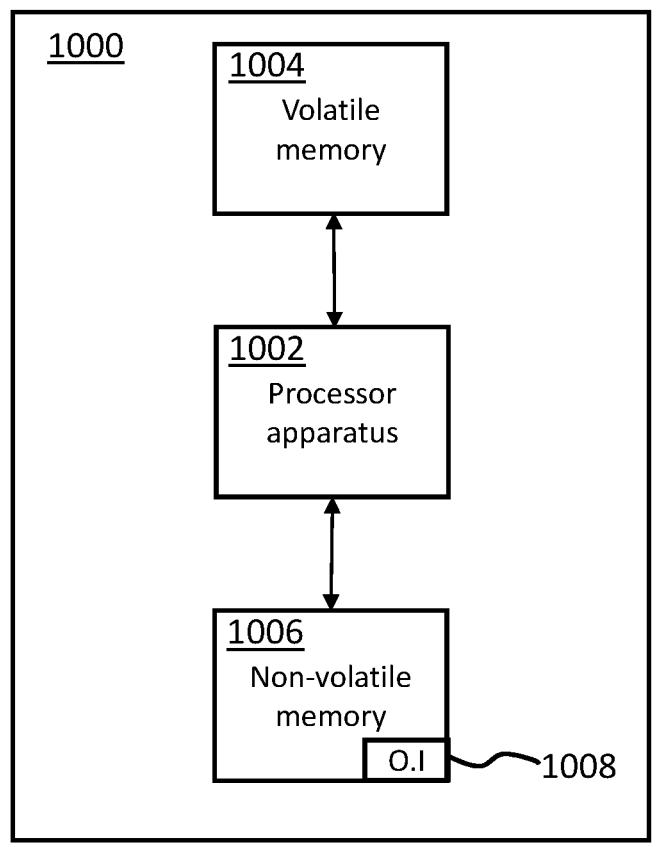
FIG. 10 shows a schematic overview of a system for performing any of the methods disclosed here.

FIG. 10 shows a schematic example of a system/apparatus moo for performing any of the methods described herein. The system/apparatus shown is an example of a computing device. It will be appreciated by the skilled person that other types of computing devices/systems may alternatively be used to implement the methods described herein, such as a distributed computing system. The system moo may form at least a part of a pre-distortion module as described herein, for example in a base station.

The apparatus (or system) woo comprises one or more processors 1002. The one or more processors control operation of other components of the system/apparatus moo. The one or more processors 1002 may, for example, comprise a general-purpose processor. The one or more processors 1002 may be a single core device or a multiple core device. The one or more processors 1002 may comprise a Central Processing Unit (CPU) or a graphical processing unit (GPU). Alternatively, the one or more processors 1002 may comprise specialised processing hardware, for instance a RISC processor or programmable hardware with embedded firmware. Multiple processors may be included.

The system/apparatus comprises a working or volatile memory 1004. The one or more processors may access the volatile memory 1004 in order to process data and may control the storage of data in memory. The volatile memory 1004 may comprise RAM of any type, for example Static RAM (SRAM) or Dynamic RAM (DRAM), or it may comprise Flash memory, such as an SD-Card.

The system/apparatus comprises a non-volatile memory 1006. The non-volatile memory 1006 stores a set of operation instructions 1008 for controlling the operation of the processors 1002 in the form of computer readable instructions. The non-volatile memory 1006 may be a memory of any kind such as a Read Only Memory (ROM), a Flash memory or a magnetic drive memory.

The one or more processors 1002 are configured to execute operating instructions 1008 to cause the system/apparatus to perform any of the methods described herein. The operating instructions 1008 may comprise code (i.e. drivers) relating to the hardware components of the system/apparatus 1000, as well as code relating to the basic operation of the system/apparatus 1000. Generally speaking, the one or more processors 1002 execute one or more instructions of the operating instructions 1008, which are stored permanently or semi-permanently in the non-volatile memory 1006, using the volatile memory 1004 to store temporarily data generated during execution of said operating instructions 1008.

Figure 11:
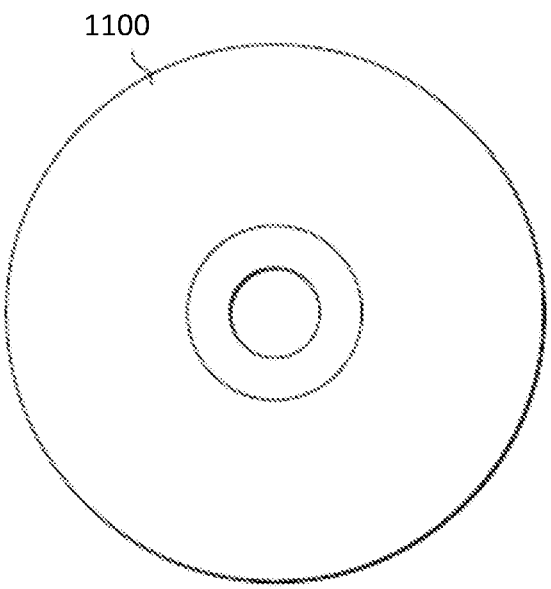
FIG. 11 shows a non-transitory media according to some embodiments.

FIG. 11 shows a non-transitory media 1100 according to some embodiments. The non-transitory media 1100 is a computer readable storage medium. It may be e.g. a CD, a DVD, a USB stick, a blue ray disk, etc. The non-transitory media 1100 stores computer program code causing an apparatus to perform operations described above when executed by a processor such as processor 1002 of FIG. 10.

Any mentioned apparatus and/or other features of particular mentioned apparatus may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

Any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

Any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

The term "signalling" may refer to one or more signals transmitted as a series of transmitted and/or received electrical/optical signals. The series of signals may comprise one, two, three, four or even more individual signal components or distinct signals to make up said signalling. Some or all of these individual signals may be transmitted/received by wireless or wired communication simultaneously, in sequence, and/or such that they temporally overlap one another.

With reference to any discussion of any mentioned computer and/or processor and memory (e.g. including ROM, CD-ROM etc.), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to examples thereof, it will be understood that various omissions and substitutions and changes in the form and details of the devices and methods described may be made by those skilled in the art without departing from the scope of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or examples may be incorporated in any other disclosed or described or suggested form or example as a general matter of design choice. Furthermore, in the claims means-plus-function clauses are intended to cover the structures described herein as performing the recited function and not only structural equivalents, but also equivalent structures.

The invention claimed is:

1. A method comprising:
  receiving an input signal comprising a first subband signal associated with a first centre frequency, $\omega 1$, and a second subband signal associated with a second centre frequency, $\omega 2$;
  applying a pre-distortion to the input signal to generate a pre-distorted signal, the pre-distortion applying an inverse to a power amplification model associated with a power amplifier; and
  outputting the pre-distorted signal for power amplification,
  and wherein the power amplification model or the inverse to the power amplification model comprises:
  a first plurality of terms, each of the first plurality of terms comprising a product of a complex coefficient, a first power factor, and the first sub band signal or the second subband signal, wherein each of the first plurality of terms is associated with a frequency centre of the first centre frequency, $\omega 1$, or the second centre frequency, $\omega 2$; and a second plurality of terms, each of the second plurality of terms comprising a product of a complex coefficient, a second power factor and a complex factor comprising a product of the first subband signal raised to a first power and a conjugate of the second subband signal raised to a second power or a product of the second subband signal raised to a first power and a conjugate of the first subband signal raised to a second power, wherein each of the second plurality of terms is associated with a frequency centre of a difference between an integer multiple of the first centre frequency and an integer multiple of the second centre frequency.

2. The method of claim 1, wherein the first and second power factors each comprise a magnitude of the first subband signal, a magnitude of the second subband signal or a product of the magnitude of the first subband signal and the second subband signal.

3. The method of claim 1, wherein each of the integer multiples of the first frequency centre differ from a corresponding integer multiply of the second frequency centre by one.

4. The method of claim 3, wherein the frequencies associated with the second plurality of terms are each of the form $(\alpha-\beta)\omega 1-(\alpha-\beta-1)\omega 2$ or $(1+\beta-\alpha)\omega 2-(\beta-\alpha)\omega 1$, where $0 \le \alpha \le m+1$ and $0 \le \beta \le m$ and $2m+1$ is an order of the corresponding term.

5. The method of claim 1, wherein the first power and second power differ by one.

6. The method of claim 1, wherein one or more of the complex factors in the second plurality of terms comprises one or more delayed first subband signals and/or one or more a delayed second subband signals.

7. The method of claim 1, wherein one or more of the power factors comprises a delayed first subband signal and/or a delayed second subband signal.

8. The method of claim 1, wherein the first subband signal comprises the input signal filtered by a first filter and the second subband signal comprises the input signal filtered by a second filter, wherein the second filter is complementary to the first filter.

9. The method of claim 8, wherein the first filter and second filter are complementary half-band filters.

10. The method of claim 1, wherein each of the plurality of second terms comprises a part of the form:

$$x\_1^{\wedge}(\alpha-\beta) \cdot x^{-}\_2^{\wedge}(\alpha-\beta-1) \cdot |x\_1|^{\wedge}2\beta \cdot |x\_2|^{\wedge}(2(m+1-\alpha)) \cdot e^{\wedge}j((\alpha-\beta)\omega\_1-(\alpha-\beta-1)\omega\_2)nT$$

when $\alpha > \beta$, and/or:

$$x\_2^{\wedge}(1+\beta-\alpha) \cdot x^{-}\_1^{\wedge}(\beta-\alpha) \cdot |x\_1|^{\wedge}2\alpha \cdot |x\_2|^{\wedge}(2(m-\beta)) \cdot e^{\wedge}j((1+\beta-\alpha)\omega\_2-(\beta-\alpha)\omega\_1)nT$$

when $\alpha \le B$, where $2m+1$ is the order of the term in the power amplification model.

11. The method of claim 1, wherein the first input signal and/or second input signal comprises a plurality of carriers.

12. The method of claim 1, further comprising applying power amplification to the pre-distorted signal using the power amplifier.

13. A base station comprising:
a receiver to receive an input signal comprising a first subband signal associated with a first centre frequency, $\omega 1$, and a second subband signal associated with a second centre frequency, $\omega 2$;

a pre-distortion module to apply a pre-distortion to the input signal to generate a pre-distorted signal, the pre-distortion applying an inverse to a power amplification model associated with a power amplifier, and outputting the pre-distorted signal for power amplification, and wherein the power amplification model or the inverse to the power amplification model comprises:

a first plurality of terms, each of the first plurality of terms comprising a product of a complex coefficient, a first power factor, and the first sub band signal or the second subband signal, wherein each of the first plurality of terms is associated with a frequency centre of the first centre frequency, $\omega 1$, or the second centre frequency, $\omega 2$; and a second plurality of terms, each of the second plurality of terms comprising a product of a complex coefficient, a second power factor and a complex factor comprising a product of the first subband signal raised to a first power and a conjugate of the second subband signal raised to a second power or a product of the second subband signal raised to a first power and a conjugate of the first subband signal raised to a second power, wherein each of the second plurality of terms is associated with a frequency centre of a difference between an integer multiple of the first centre frequency and an integer multiple of the second centre frequency.

14. A computer program product comprising a non-transitory computer readable medium that, when executed by a computing system, causes the system to perform:

receiving an input signal comprising a first subband signal associated with a first centre frequency, $\omega 1$, and a second subband signal associated with a second centre frequency, $\omega 2$;

applying a pre-distortion to the input signal to generate a pre-distorted signal, the pre-distortion applying an inverse to a power amplification model associated with a power amplifier; and outputting the pre-distorted signal for power amplification, and wherein the power amplification model or the inverse to the power amplification model comprises:

a first plurality of terms, each of the first plurality of terms comprising a product of a complex coefficient, a first power factor, and the first sub band signal or the second subband signal, wherein each of the first plurality of terms is associated with a frequency centre of the first centre frequency, $\omega 1$, or the second centre frequency, $\omega 2$; and a second plurality of terms, each of the second plurality of terms comprising a product of a complex coefficient, a second power factor and a complex factor comprising a product of the first subband signal raised to a first power and a conjugate of the second subband signal raised to a second power or a product of the second subband signal raised to a first power and a conjugate of the first subband signal raised to a second power, wherein each of the second plurality of terms is associated with a frequency centre of a difference between an integer multiple of the first centre frequency and an integer multiple of the second centre frequency.

* * * * *